US006955215B2

(12) United States Patent
Al-Garni et al.

(10) Patent No.: US 6,955,215 B2

(45) Date of Patent: Oct. 18, 2005

(54) HYBRID COOLING SYSTEM AND METHOD FOR COOLING ELECTRONIC DEVICES

(75) Inventors: Ahmed Z. Al-Garni, Dhahran (SA); Muhammad A. Hawwa, Dhahran (SA)

(73) Assignee: King Fahd University of Petroleum and Minerals, Dharan (SA)

( * ) Notice: Subject to any disclaimer, the term of this patent is extended or adjusted under 35 U.S.C. 154(b) by 0 days.

(21) Appl. No.: 10/795,420

(22) Filed: Mar. 9, 2004

(65) Prior Publication Data

US 2005/0199383 A1 Sep. 15, 2005

(51) Int. Cl.[7] .................................................. F28F 7/00

(52) U.S. Cl. ...................... 165/185; 165/80.3; 361/704

(58) Field of Search ......................... 165/80.2, 86, 185, 165/80.3, 104.33, 104.34, 121, 122; 361/690–699, 361/704, 714, 715; 257/706, 721

(56) References Cited

U.S. PATENT DOCUMENTS

| | | | |
|---|---|---|---|
| 2,834,582 A | 5/1958 | Kablitz | |
| 3,158,198 A | 11/1964 | Hunter, Jr. | |
| 3,956,673 A | 5/1976 | Seid | |
| 4,144,932 A | 3/1979 | Voigt | |
| 4,235,283 A | 11/1980 | Gupta | |
| 4,541,004 A | 9/1985 | Moore | |
| 4,603,243 A | 7/1986 | Septfons et al. | |
| 4,616,693 A | 10/1986 | Dietzsch et al. | |
| 4,880,049 A | 11/1989 | Jaeger | |
| 4,986,346 A | 1/1991 | Blackmon et al. | |
| 5,021,924 A | 6/1991 | Kieda et al. | |
| 5,062,471 A | 11/1991 | Jaeger | |
| 5,092,241 A | 3/1992 | Feser et al. | |
| 5,119,142 A | 6/1992 | Swapceinski et al. | |
| 5,221,181 A | 6/1993 | Ferleger et al. | |
| 5,288,203 A | 2/1994 | Thomas | |
| 5,292,230 A | 3/1994 | Brown | |
| 5,335,143 A | 8/1994 | Maling, Jr. et al. | |
| 5,424,914 A | 6/1995 | Smith et al. | |
| 5,504,924 A | 4/1996 | Ohashi et al. | |
| 5,562,089 A * | 10/1996 | Astle, Jr | 126/117 |
| 5,597,035 A * | 1/1997 | Smith et al. | 165/80.3 |
| 5,609,202 A | 3/1997 | Anderson et al. | |
| 5,615,085 A | 3/1997 | Wakabayashi et al. | |
| 5,734,552 A | 3/1998 | Krein | |
| 5,828,549 A * | 10/1998 | Gandre et al. | 361/695 |
| 6,000,997 A | 12/1999 | Kao et al. | |
| 6,050,326 A | 4/2000 | Evans et al. | |
| 6,168,379 B1 * | 1/2001 | Bauer | 416/23 |
| 6,175,495 B1 | 1/2001 | Batchelder | |
| 6,333,852 B1 | 12/2001 | Lin | |
| 6,371,200 B1 | 4/2002 | Eaton | |
| 6,373,700 B1 | 4/2002 | Wang | |
| 6,467,274 B2 * | 10/2002 | Barclay et al. | 62/3.1 |
| 6,567,640 B2 * | 5/2003 | Ishikawa et al. | 399/329 |

* cited by examiner

*Primary Examiner*—Tho v Duong

(74) *Attorney, Agent, or Firm*—Dennison, Schultz, Dougherty & MacDonald

(57) ABSTRACT

A hybrid cooling system for cooling electronic devices includes a heat generating electronic device and an endless metal belt in sliding contact with a surface of the device for removing heat by conduction. The system also includes a fan or jet and an airfoil with and without a movable surface and/or flap for simultaneously directing a flow of coolant across the electronic device and/or the endless metal belt. An additional cooling element and cooling fins are also disclosed. Further, a method for cooling such devices is disclosed.

10 Claims, 6 Drawing Sheets

HYBRID COOLING SYSTEM AND METHOD FOR COOLING ELECTRONIC DEVICES

FIELD OF THE INVENTION

The present invention relates to a hybrid cooling apparatus and method for cooling electronic devices and more particularly to a hybrid cooling apparatus and method for cooling integrated circuit chips and the like.

BACKGROUND FOR THE INVENTION

High performance microprocessors and integrated circuit chips generate considerable heat in small spaces. Further, as the processing speeds are increased so is the amount of heat generated. Accordingly, there is a continuing need for improved thermal cooling to maintain acceptable operating perimeters.

Recently, a number of computer processor manufactures have employed heat sinks such as fined metallic pieces put on the chips to dissipate heat by conduction and fans to increase the heat loss by convection. For example, U.S. patent of Krein, U.S. Pat. No. 5,734,552 discloses an airfoil deflector for cooling components. As disclosed therein, a deflector shaped in cross-section like an airfoil directs a stream of fluid such as air from a fan toward a heat-generating chip to improve cooling of the chip. The foil is inverted as compared with an airplane wing to produce an inverse lift at reduced temperatures to cool a heat sink thermally. The airflow effect also moves air away from the component at increased velocity to cool it more rapidly. In confined areas multiple deflectors may be arranged in the manner of sails of a boat for augmenting cooling.

A further approach for cooling an electronic device is disclosed in a U.S. Pat. No. 6,050,326 of Evans et al. The Evans et al. patent discloses a method and apparatus for cooling one or more electronic devices. The apparatus utilizes a moving heat sink, a portion of which is in contact with the device to be cooled. The moving heat sink may be in the form of a rotating disk, moving belt or strip and may be made from metal or plastic.

A more recent approach for cooling electronic devices is disclosed in a U.S. Pat. No. 6,371,200 of Eaton which discloses a perforated heat sink having high heat dissipation. As described in the patent, the heat sink includes a substrate with a multitude of holes and a thermal conductive pathway to conduct heat from a heat source to the substrate. The surface area of the holes is equal to or greater than the surface of the substrate without the holes.

Notwithstanding the above, it is presently believed that there is a need for an improved cooling system and method for cooling heat generating electronic devices such as integrated circuit chips. It is also believed that the present need and a potential commercial market will increase as the speed of such devices increases. Further advantages contemplated by the present invention are a relatively compact size, a need for a reasonable amount of power, relatively silent operation and a competitive cost.

BRIEF SUMMARY OF THE INVENTION

In essence, the present invention contemplates a cooling system for cooling an integrated circuit chip or logic chip hereinafter referred to as an integrated circuit chip. The system includes a heat generating integrated circuit chip having a heat emanating surface and conductive means such as an endless metal belt in sliding contact with the heat emanating surface. The cooling system also includes convection means such as a fan or jet for simultaneously moving a cooling fluid such as air across the conductive means for removing dissipated heat from the chip by convection.

In a first embodiment of the invention, the convection means includes means such as a fan for passing an airflow over the convection means and an airfoil having a leading edge and a trailing edge, a first surface remote from the heat emanating surface and a second convex surface opposite from the heat emanating surface but separated therefrom by a portion of the heat transfer element and a predetermined space to thereby define a convergent divergent duct shape to thereby increase the flow speed and alter the pressure distribution on the conduction means.

The present invention also contemplates a method for cooling a heat generating electronic device which includes the step of providing a heat generating electronic device having a heat emanating surface and removing heat from the heat emanating surface by convection as for example by providing a heat absorbing material having a surface area larger than the heat emanating surface in sliding contact with the heat emanating surface and moving the heat absorbing material across the heat emanating surface. The method also includes the step of simultaneously removing dissipated heat from the electronic device by convection, as for example by moving a cooling fluid such as air across the heat absorbing material and/or chip. In this embodiment of the invention the speed of the cooling medium is increased as it flows across the heat absorbing material and the pressure distribution across the heat absorbing material and/or chip is altered.

The invention will now be described in connection with the following figures wherein like reference numerals have been used to identify like parts.

DESCRIPTION OF THE PREFERRED EMBODIMENTS OF THE INVENTION

Figure 1A:
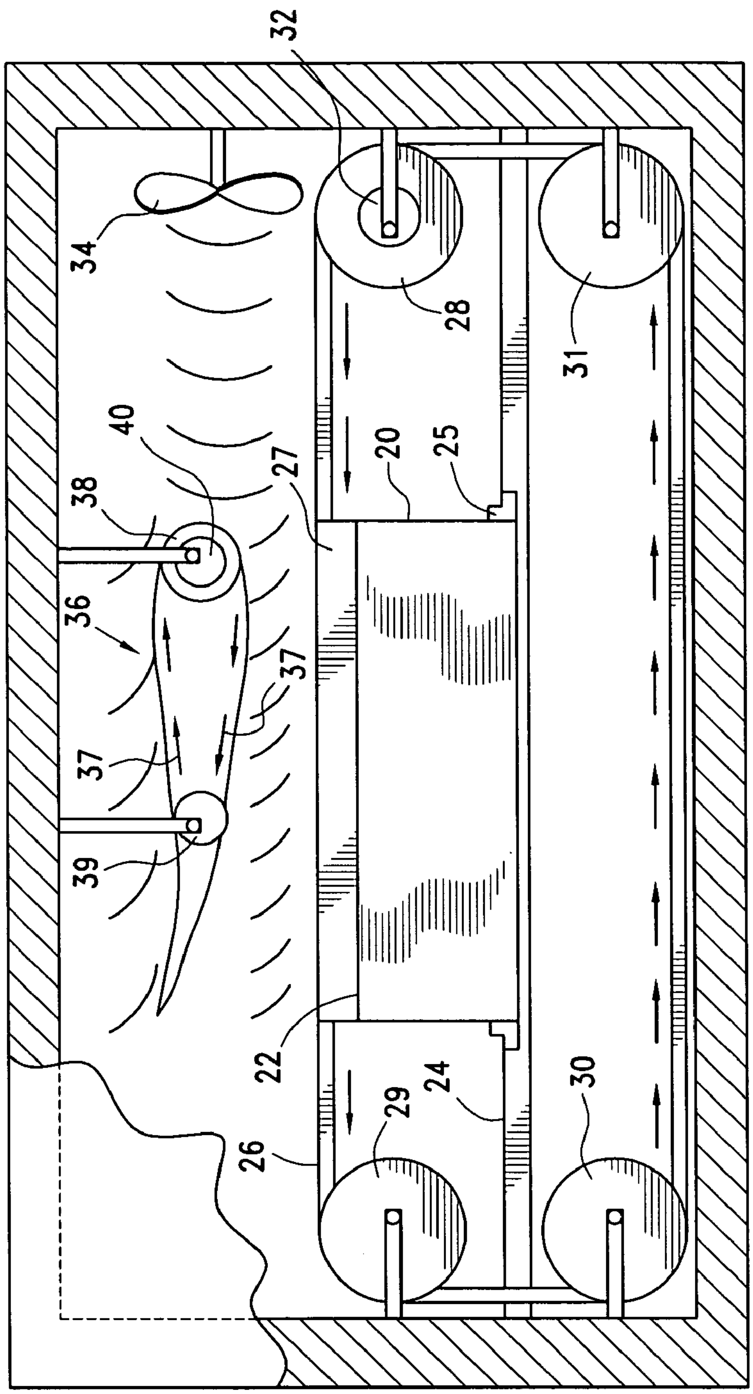
FIG. 1*a* is a schematic illustration of a first embodiment of the invention.
Figure 2:
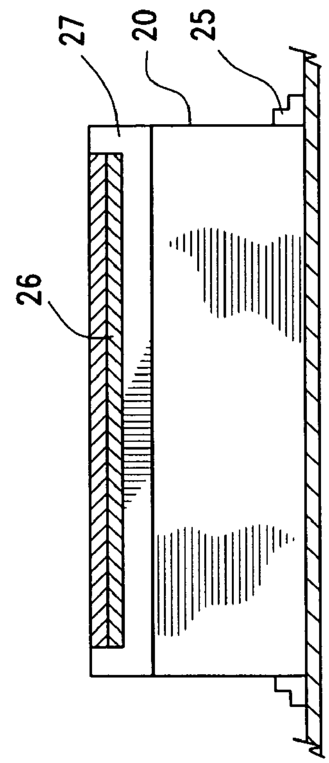
FIG. 2 is a side view which illustrates the first embodiment of the invention.
Figure 1B:
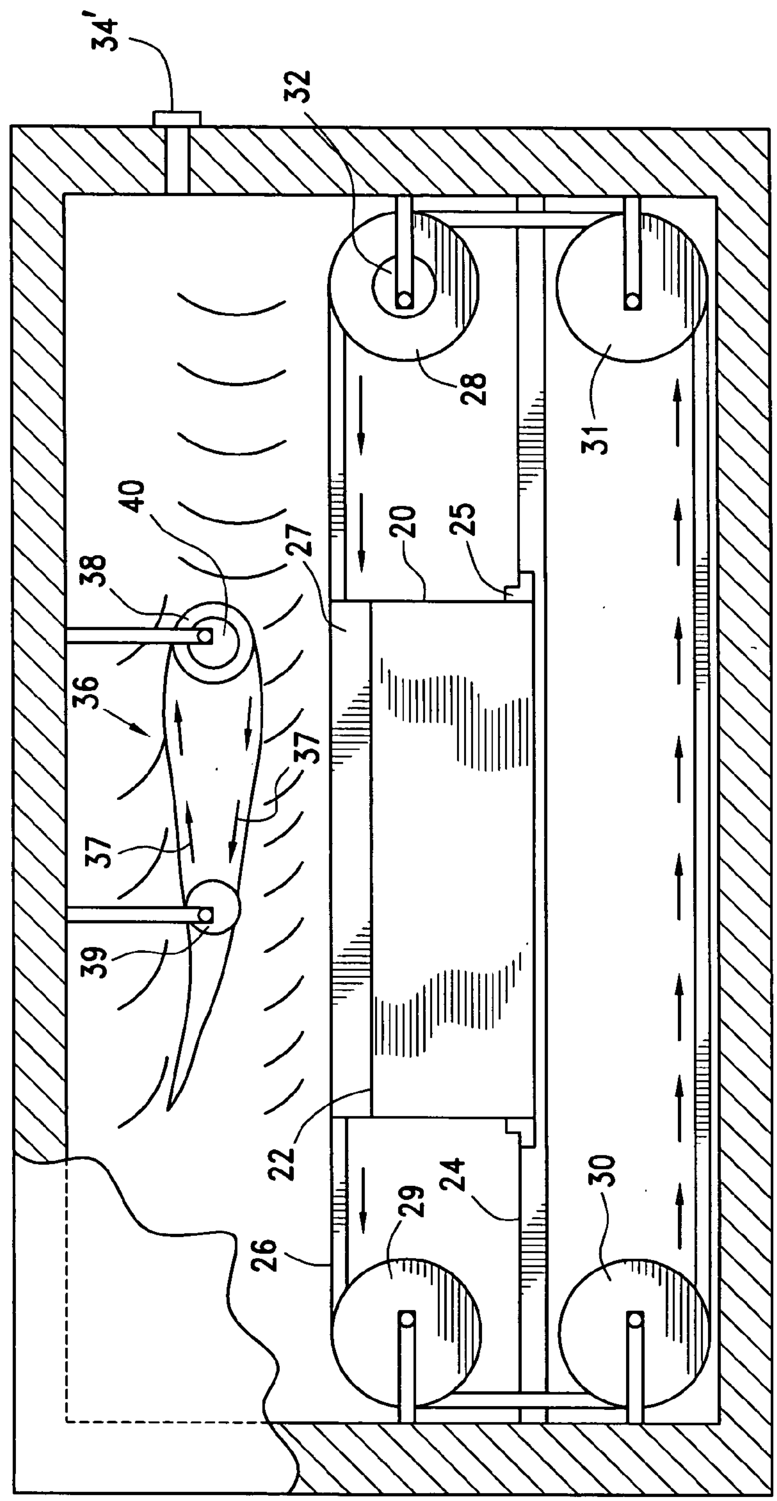
FIG. 1*b* is a schematic illustration of a further embodiment of the invention.

A hybrid cooling system or apparatus for cooling a heat generating electronic device in accordance with a first embodiment of the invention is illustrated in FIGS. 1 and 2. As shown in FIGS. 1 and 2, the hybrid cooling system includes an electronic device such as an integrated circuit chip 20 which includes an upper heat emanating surface 22. In practice the chip 20 is fixed to a printed circuit board 24 and held in place thereon by sodder or other conventional means 25.

An endless belt 26 of a heat absorbing and dissipating material such as a metal as for example stainless steel, aluminum, copper, etc. is disposed in contact with the heat emanating surface 22. As illustrated a C-shaped channel 27 which may be made of metal such as stainless steel or other suitable material guides an endless belt 66 which may be in sliding contact with the channel 27 or in contact with the surface 22. However, it should be recognized that the invention contemplates an endless belt 26 which is in direct contact with the heat emanating surface 22 or an indirect contact therewith by contacting the channel 27.

The endless belt 26 passes around a plurality of rollers 28, 29, 30 and 31 and is moved across the heat emanating surface by means of a gear 32 or other conventional means. The moving belt 26 is in sliding contact with the surface of the chip 20 or with a C-shaped channel 27 and acts as a moving heat sink as different portions of the belt 26 come in contact with the surface 22 of the chip or with the C-shaped channel 27.

A fan 34 or jet 34' simultaneously directs a flow of air or other cooling fluid across the surface of the belt 26 preferably in the area immediately adjacent to the C-shaped channel 27.

A negatively cambered airfoil 36 is disposed above the C-shaped channel 27 and chip 20. This airfoil 36 forms a convergent-divergent duct shape with the C-channel and belt 26. In a preferred embodiment of the invention, the airfoil 36 or wing includes a moving skin or belt 37 which moves in the same direction as the moving belt 26. The advantage of the airfoil/wing is to improve the cooling process by increasing the airflow speed and altering the pressure distribution across the moving belt or chip. This reduces the temperature according to the gas law as manifested by the equation pv=nRT where p is the absolute pressure, v is the volume, n is the number of moles, R is the universal gas constant and T is the absolute temperature. Further, the moving skin or belt 37 increases the speed of adjacent airflow leading to a decrease in the temperature and more rapid removal of the heated air above the chip. In other words, it increases the rate of cooling according to Bernoulli's equation ($P+\frac{1}{2}\rho V^2$=constant where P is the pressure, p is the fluid density and V is the fluid velocity.

As illustrated in FIG. 1, the moving skin 37 passes around a pair of rollers 38 and 39 and is moved by means of a gear 40 or other suitable means such as a motor (not shown).

It is also contemplated that the wing like airfoil can be replaced with other geometric shapes that will produce the convergent-divergent duct effect.

Figure 3:
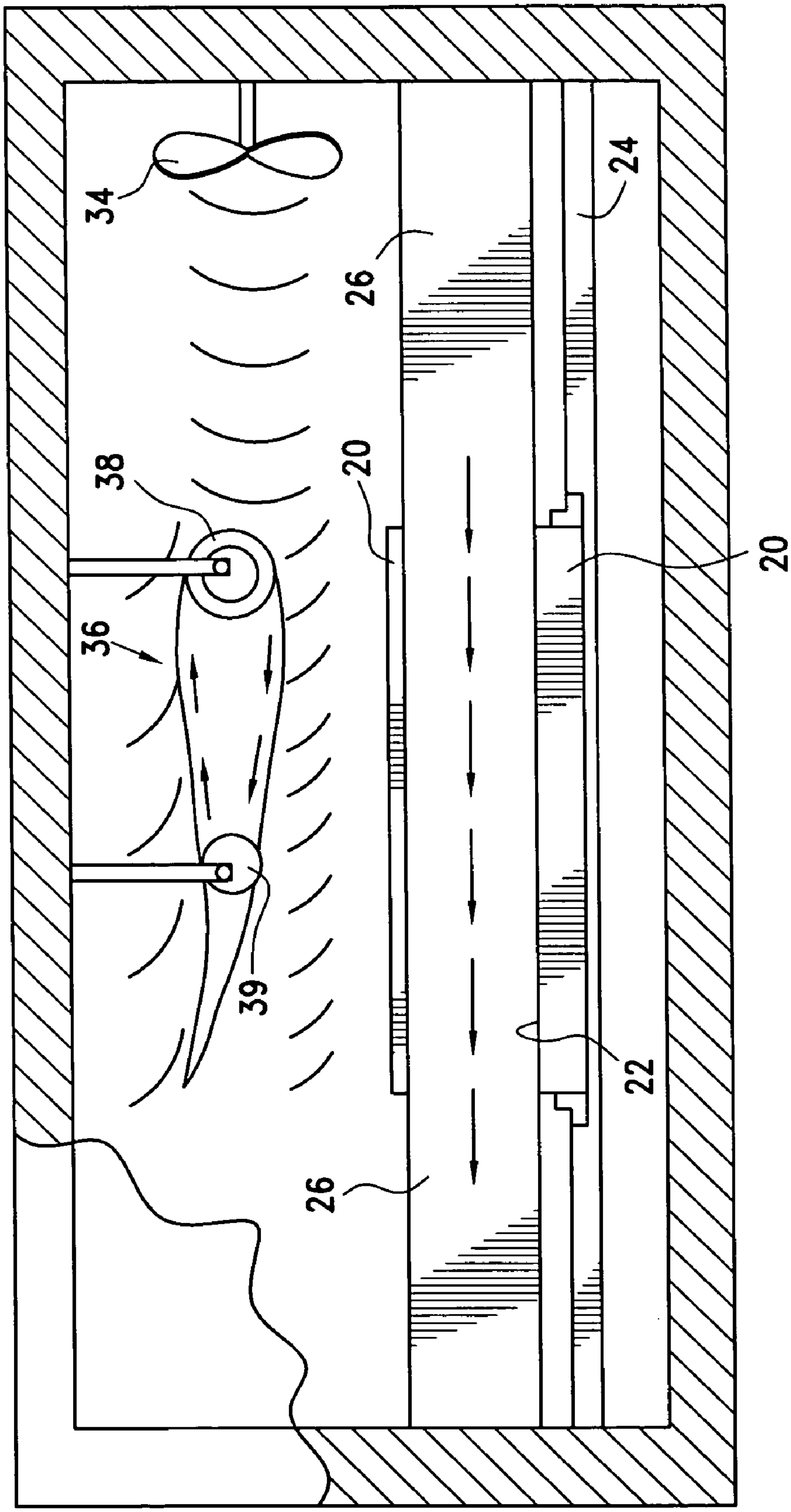
FIG. 3 is a schematic illustration of a second embodiment of the invention.
Figure 4:
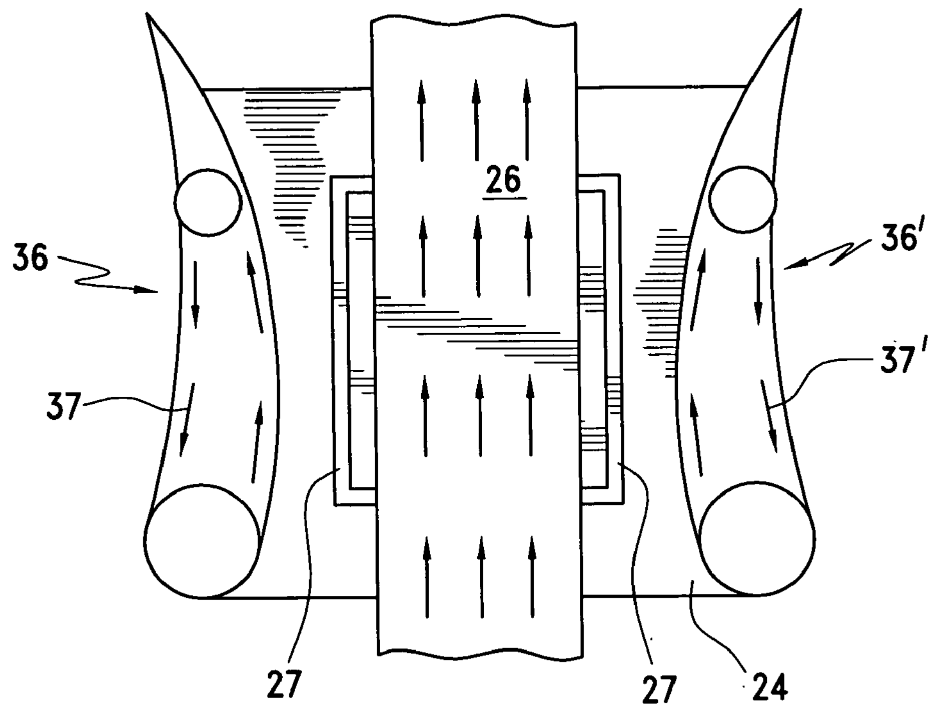
FIG. 4 is a schematic illustration of a third embodiment of the invention.

A further embodiment of the invention as shown in FIG. 3 wherein an endless belt 26 is disposed along the sides of the chip 20. A single belt is illustrated along one side of the chip 20, but two belts with one belt on each of two opposite sides is also contemplated. A still further embodiment of the invention is shown in FIG. 4 which includes an endless belt 26, and C-channel 27 for guiding the belt 26 disposed on each side of the chip 20. As illustrated in FIG. 4, airfoils 36 36' are disposed one on each side on each of two opposite sides of the chip 20 and the endless belt 26 moves across the chip 20 and C-shaped channel 27. The airfoils may include movable skins 37 37'.

Figure 5:
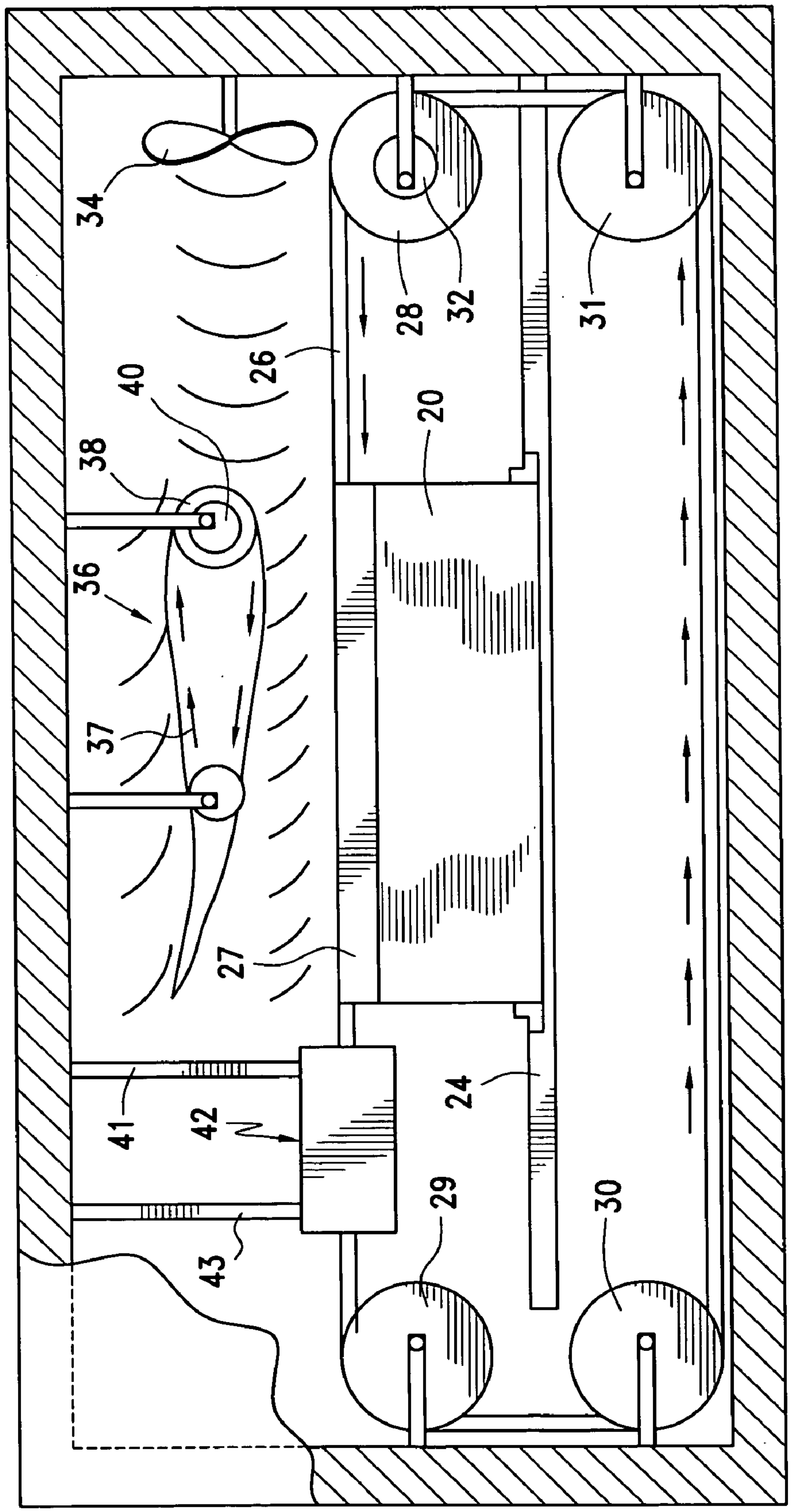
FIG. 5 is a schematic illustration of a further embodiment of the invention.

A still further embodiment of the invention is illustrated in FIG. 5 which is generally similar to the first embodiment but includes an additional cooling element 42. As illustrated, this cooling element is connected to a source of refrigerant (not shown) by a pipe 41, includes an exhaust pipe 43 and is adapted to have the endless belt 26 pass there through for further or more rapid cooling of the belt 26. As shown, the cooling element 42 is disposed adjacent to the chip 20 so that the endless belt 26 passes through the cooling element 42 just after passing over the chip 20 and out of the C-channel 27. Various coolants such as $H_2$, $CH_4$, He, Ne, $N_2$ or Ar or other fluid may be used for optimizing the cooling efficiency.

Figure 6A:
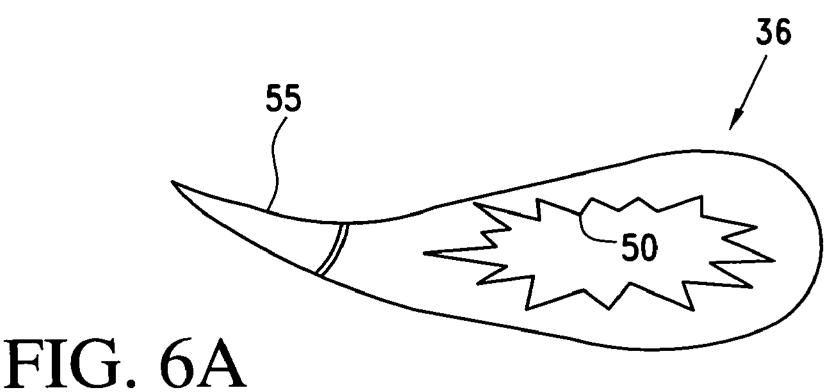
FIG. 6*a* is a schematic illustration of yet another embodiment of the invention.
Figure 6B:
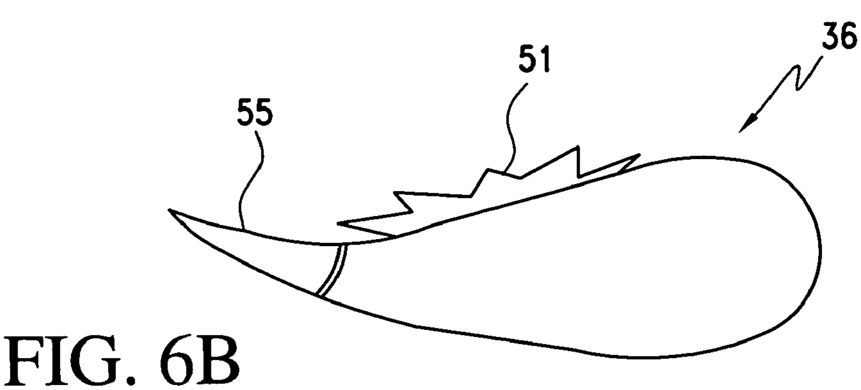
FIG. 6*b* is a schematic illustration of an additional embodiment of the invention.

Further, the airfoil 36 may include interior cooling fins 50 as shown in FIG. 6*a* and/or exterior cooling fins 51 for additional cooling as shown in FIG. 6*b*. In addition, a flap 55 or slats can be used to produce more favorable velocity/pressure/temperature profiles. It is also contemplated that fins can also be added to the flanges on the C-shaped channel.

Figure 7:
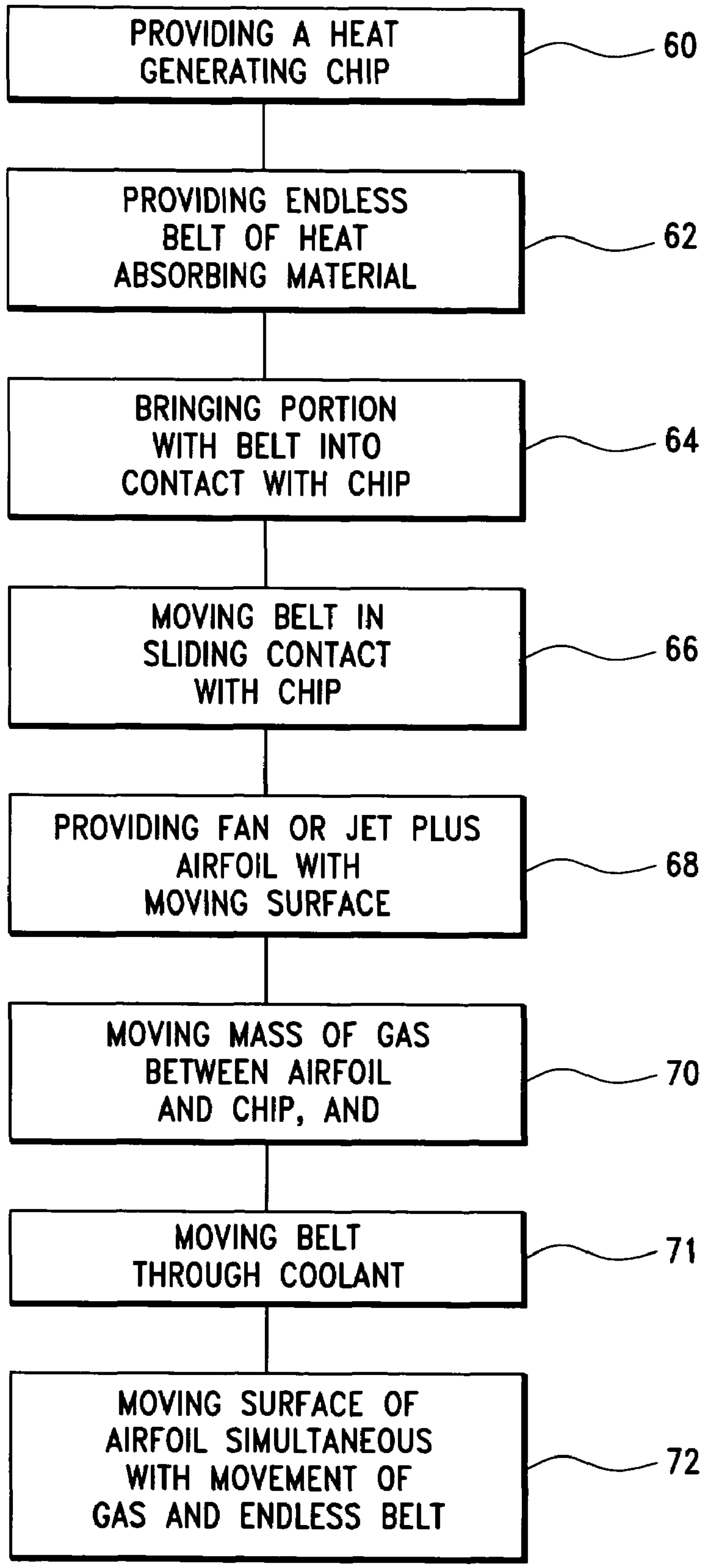
FIG. 7 is a diagram which illustrates a method in accordance with the invention.

A method for cooling an integrated circuit chip as illustrated in FIG. 7. As illustrated therein, the method comprises a step 60 of providing a heat generating integrated circuit chip having an heat emanating surface, and a step 62 of providing an endless metal belt of a heat absorbing and dissipating material such as stainless steel, copper, aluminum, etc. The endless belt has a surface area which is considerably larger then the surface area of the heat emanating surface. In step 64, a portion of the endless belt is brought into sliding contact with the chip either directly or indirectly as for example by an intermitent C-shaped channel guide and the belt is moved across a heat emanating surface of the chip in step 66. The method also includes a step 68 of providing a fan or air jet and an airfoil for directing a flow of air or other coolant across the moving belt and/or chip. This airfoil may or may not include a moving surface and or flap to produce more favorable velocity, pressure, temperature profiles. A mass of cooling fluid such as air is directed between the airfoil and the chip in step 70 and in step 72 the moving surface and/or flap is moved to provide optimum cooling.

In one embodiment of the invention the endless belt is moved through a coolant in step 71.

While the invention has been described in connection with its preferred embodiments, it should be recognized that changes and modifications may be made therein without departing from the scope of the appended claims.

What is claimed is:

1. A cooling system for cooling an integrated circuit chip comprising a heat generating chip having a heat emanating surface, conduction means including an endless heat absorbing belt having a first surface with a surface area larger than the heat emanating surface in sliding contact with said heat emanating surface and means for moving said surface of said endless belt across said heat emanating surface in sliding contact therewith, a fan for simultaneously moving a flow of air across said endless belt and a negatively cambered airfoil disposed in the flow of air for increasing the speed of air flowing across said endless belt and for altering the air pressure distribution on said endless belt and in which said negatively cambered airfoil includes a moving skin of heat absorbing and heat dissipating material.

2. A cooling system for cooling an integrated circuit chip in accordance with claim 1 in which said heat absorbing and heat dissipating material is a metal.

3. A hybrid cooling system for a heat generating electronic device having an outer surface, said system comprising:

a heat transfer element in the form of an endless belt having a first surface with a surface area larger than the outer surface of the electronic device and with a portion of said first surface in sliding contact with an outer surface of the electronic device;

means for moving said heat transfer element relative to the outer surface of the electronic device to bring different portions of the firs surface of the heat transfer element in sliding contact with the electronic device to thereby remove heat from the electronic device;

an airfoil having a leading edge and a trailing edge, a first surface remote from the electronic device and a second convex surface opposite from the electronic device and separated therefrom by a portion of said heat transfer element and a predetermined space; and means for forcing a unidirectional flow of a gaseous cooling medium toward said leading edge and between said convex surface and said heat transfer device to define a convergent-divergent duct shape to increase the flow speed and alter the pressure distribution on the heat transfer element, and in which said airfoil includes a movable skin of heat absorbing/heat dissipating material.

4. A hybrid cooling system for a heat generating electronic device having an outer surface according to claim 3 which includes a coolant and wherein said endless belt passes through said coolant.

5. A hybrid cooling system for a heat generating electronic device according to claim 4 which includes a C-shaped channel guide for positioning said endless belt with respect to said heat emanating surface.

6. A method for cooling an integrated circuit chip comprising the steps of:

a) providing a heat generating integrated circuit chip having a heat emanating surface;

b) provides an endless belt of a heat absorbing material;

c) bringing a portion of the endless belt in sliding contact with a surface of an integrated circuit chip;

d) moving the endless belt in sliding contact with the surface of the integrated circuit chip across the integrated circuit chip to thereby remove heat from the chip;

e) providing a negatively cambered airfoil having a leading edge, a trailing edge and a convex surface opposite from the endless belt and separated therefrom by a predetermined space;

f) moving a mass of unidirectional gaseous coolant between the airfoil and the endless belt to thereby remove heat from the endless belt; and, g) providing the airfoil with a movable heat absorbing/heat dissipating skin and moving the movable skin around the airfoil to dissipate heat therefrom.

7. A method for cooling an integrated circuit chip according to claim 6 which includes the step of proving a coolant and passing the endless belt through the coolant.

8. A hybrid cooling system for a heat generating electronic device according to claim 6 in which said airfoil includes cooling fins.

9. A hybrid cooling system for a heat generating electronic device according to claim 6 in which said airfoil includes a movable flap for producing more favorable velocity, pressure and/or temperature profiles.

10. A method for cooling an integrated circuit chip comprising the steps of:

a) providing a heat generating integrated circuit chip having a heat emanating surface;

b) providing an endless belt of heat absorbing and heat dissipating material with a surface area larger than the surface area of the heat emanating surface;

c) bringing the surface area of the endless belt into sliding contact with the heat emanating surface and moving the surface of the endless belt in sliding contact across the heat emanating surface to thereby remove heat from the integrated circuit chip by conductance;

d) simultaneously directing a flow of air across the endless belt to thereby remove heat therefrom by convection;

e) altering the speed of the airflow across the endless belt and varying the pressure on the belt by providing a negatively cambered airfoil and disposing the airfoil in the airflow above the integrated circuit chip; and f) providing the airfoil with a heat absorbing/heat dissipating skin and moving the skin to thereby dissipate heat from the integrated circuit chip.

* * * * *